United States Patent [19]

Gabrielsson et al.

[11] 4,041,417
[45] Aug. 9, 1977

[54] LOW DUTY CYCLE PULSE GENERATOR USING TWO THYRISTORS

[75] Inventors: Arne Göran Gabrielsson, Vallingby; Jan Erik Lindström, Spanga, both of Sweden

[73] Assignee: Telefonaktiebolaget L M Ericsson, Stockholm, Sweden

[21] Appl. No.: 690,421

[22] Filed: May 27, 1976

[30] Foreign Application Priority Data

June 19, 1975 Sweden .............................. 7507127

[51] Int. Cl.² .............................................. H03K 3/35
[52] U.S. Cl. .................................. 331/107 R; 331/111
[58] Field of Search .............. 331/111, 113 R, 107 R; 307/284, 305

[56] References Cited

U.S. PATENT DOCUMENTS

| 3,206,696 | 9/1965 | Wright ............................ 331/111 X |
| 3,302,128 | 1/1967 | Schoemehl et al. ............. 331/111 X |

OTHER PUBLICATIONS

Electronics, Dec. 11, 1967, pp. 194, 196.

Primary Examiner—Siegfried H. Grimm
Attorney, Agent, or Firm—Hane, Sullivan & Spiecens

[57] ABSTRACT

A pulse generator with a low duty factor includes a capacitor arranged to alternately be charged via a first current path and discharged via a second current path, the second current path has a thyristor element with its anode-cathode circuit connected across the capacitor and is arranged to be activated by a predetermined capacitor voltage and to be deactivated by a second thyristor element. A resistor network has a first resistor means connected between the anodes of the thyristor elements and two second and third resistor means arranged to connect a pole of the capacitor to the anode of the first thyristor element and to the anode of the second thyristor element respectively. The second thyristor element is arranged to be provided with a trigger voltage generated across a cathode load of the first thyristor element.

2 Claims, 1 Drawing Figure

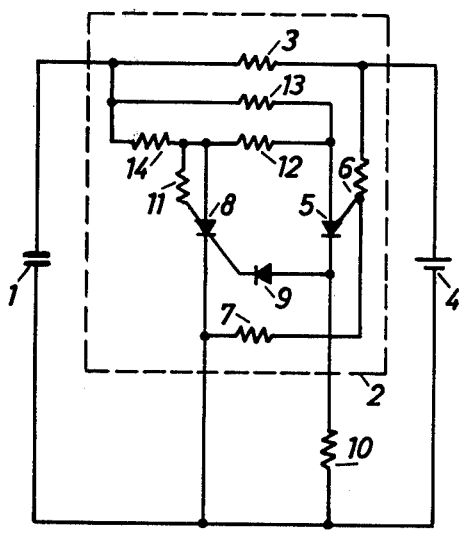

LOW DUTY CYCLE PULSE GENERATOR USING TWO THYRISTORS

The invention refers to a pulse generator with a low duty factor, comprising a capacitor arranged to be alternately charged via a first current path and discharged via a second current path, the second current path comprising a thyristor element which has its anode-cathode circuit connected across the capacitor and is arranged to be activated by a predetermined capacitor voltage and to be deactivated by a second thyristor element.

Pulse generators of the above-mentioned kind are described on page 434 in the publication Transistor Manual, General Electric Co., 1964. Besides such capacitor and thyristor element, a further capacitor and thyristor element is included in a multivibrator circuit that features a separate setting of the pulse time and the pause time.

The pulse generator according to the invention contains as the known pulse generators two thyristor elements and features a separate setting of pulse time and pause time down to very low duty factors. However it only requires one capacitor. Its thyristor elements and other circuit elements, which are extraordinarily few in number, are easy to integrate in a monolithic embodiment.

The pulse generator according to the invention, the characteristics of which appear from the appended claims, will now be described more in detail with reference to the accompanying drawing which shows a circuit diagram of a preferred embodiment of the invention.

The drawing shows a pulse generator in a preferred embodiment of the invention. The pulse generator comprises a capacitor 1 arranged to alternately be charged via a first current path and discharged via a second current path through a monolithic integrated circuit 2. The first current path comprises a resistor 3 and a voltage source 4 connected in series and located outside the monolithic circuit 2, while the second current path comprises a thyristor element 5 which has its anode-cathode circuit connected across the capacitor 1 and is arranged to be activated by a predetermined voltage across such circuit. For this purpose the thyristor element 5 is provided with an anode gate connected to an output of a voltage divider consisting of two series connected equivalued resistors 6 and 7 which are connected across the voltage source 4.

The main idea of the invention is that the anode-cathode circuit of the thyristor element 5 is connected to the capacitor 1 via a voltage divider circuit in which the shunt circuit is constituted by an anode-cathode circuit of a second thyristor element 8 which is arranged to be activated in dependence on the activation state of thyristor element 5. According to the preferred embodiment of the invention the voltage divider circuit is, in the activated condition of the thyristor element 8, arranged to reduce said predetermined voltage to approximately 3½ diode voltage drops, the thyristor element 8 having a cathode gate arranged to be, via an isolation diode 9, supplied with a trigger voltage from the cathode load 10 of the thyristor element 5 and located outside the monolithic circuit 2. This trigger voltage, which also constitutes the output voltage of the pulse generator, ceases after a short period of time when the output voltage from the voltage divider circuit due to the discharge of the capacitor 1 decreases below three diode voltage drops with the consequence that the thyristor element is deactivated. The discharge of the capacitor 1 continues until also the thyristor element 8 is deactivated, the deactivation of this being ensured by the fact that the thyristor element 8 has an anode gate connected to its anode via a relatively low-ohmic resistor 11.

Besides the thyristor element 8 the voltage divider circuit comprises a resistor 12 connected between the anodes of the thyristor elements 5 and 8 and two resistors 13, and 14, connected between the anode of the respective thyristor element and the connection point between the resistor 3 and the capacitor 1 and having a high and a low resistance, respectively, as compared to the resistance of resistor 12. In the preferred embodiment of the invention the following resistance values of the resistors in the monolithic circuit 2 are used: 20 kilo-ohm for the resistors 3, 6 and 7, 150 ohm for the resistor 11, 300 ohm for the resistor 12, 1.2 kilo-ohm for the resistor 13, and 20 ohm for the resistor 14. A capacitance value of 0.33 $\mu$F for the capacitor 1 gives the pulse generator a pause time of the magnitude of millisecond and a pulse time of the magnitude of microsecond.

The thyristor elements 5 and 8 are conventional four-layer elements arranged as a programable unijunction transistor and a thyristor tetrode respectively. The voltage of the voltage source 4 is according to the example 12 V.

The described embodiment of the invention can be modified in many ways within the scope of the appended claims. For example, the delta connection network constituted by the resistors 12, 13 and 14 may be replaced by an equivalent star connection network.

We claim:
1. A pulse generator with a low duty factor comprising a power supply, a capacitor having a pair of terminals connected across said power supply and arranged to alternately be charged via a first current path including a charging resistance means and discharged via a second current path, the second current path comprising a first thyristor element having its anode-cathode circuit connected across the capacitor and being arranged to be activated by a predetermined capacitor voltage and to be deactivated by a second thyristor element, means connected across said power supply for maintaining the anode gate of said first thyristor element at a predetermined fraction of the voltage of the power supply, a resistor network comprising a first resistor means connected between the anodes of the thyristor elements and second and third resistor means arranged to connect a first terminal of the capacitor to the anode of the first thyristor element and to the anode of the second thyristor element, respectively, the second thyristor element being arranged to be provided with a trigger voltage generated across a cathode load of the first thyristor element, low resistive means connecting the anode gate of said second thyristor element to the anode thereof, and means for connecting the cathode of said second thyristor element to the second terminal of said capacitor.

2. A pulse generator according to claim 1, wherein said second thyristor element is arranged to be provided with said trigger voltage via a diode element and said resistor network is, when the second thyristor element is activated, arranged to supply to the first thyristor element and its cathode load a voltage amounting to at least three diode voltage drops.

* * * * *